United States Patent [19]

Juan

[11] Patent Number: 4,725,924
[45] Date of Patent: Feb. 16, 1988

[54] ELECTRONIC UNIT ESPECIALLY FOR MICROCIRCUIT CARDS AND CARD COMPRISING SUCH A UNIT

[75] Inventor: Alain Juan, Chézard, Switzerland

[73] Assignee: EM Microelectronic-Marin SA, Marin, Switzerland

[21] Appl. No.: 849,742

[22] Filed: Apr. 9, 1986

[51] Int. Cl.$^4$ .......................... H05K 1/00; G06K 19/06
[52] U.S. Cl. ..................................... 361/398; 361/408; 357/80; 235/492; 29/841
[58] Field of Search ............... 361/392, 395, 398, 408; 357/80; 29/831, 841; 235/492

[56] References Cited

U.S. PATENT DOCUMENTS

| 4,042,861 | 8/1977 | Yasuda et al. | 361/398 X |
| 4,216,577 | 8/1980 | Badet et al. | 29/831 |
| 4,222,516 | 9/1980 | Badet et al. | 357/80 X |
| 4,501,960 | 2/1985 | Jouvet et al. | 235/492 |
| 4,509,098 | 4/1985 | DasGupta et al. | 29/831 X |
| 4,532,419 | 7/1985 | Takeda et al. | 357/80 X |
| 4,539,472 | 9/1985 | Poetker et al. | 235/492 X |

FOREIGN PATENT DOCUMENTS

| 0113117 | 8/1984 | European Pat. Off. |
| 2337381 | 7/1977 | France . |
| 2438339 | 4/1980 | France . |
| 2523335 | 9/1983 | France . |

Primary Examiner—J. R. Scott
Assistant Examiner—Derek S. Jennings
Attorney, Agent, or Firm—Kevin McMahon

[57] ABSTRACT

A small electronic unit for use especially in the manufacture of microcircuit cards, e.g. credit cards, carpark cards, telephone call payment cards, etc. which includes an integrated circuit positioned in an aperature in a flexible sheet of insulating material which sheet carries a plurality of electrical conductive strips that extends into the aperature and are fastened, soldered or adhesively bonded to the terminals of the chip. The flexible sheet is carried either directly or through the intermediary of the conductive strips by a support member which is deformable under bending and twisting stresses. At least a major sector of the area of the flexible sheet surrrounding the aperature is free to move with respect to the support for substantially isolating the chip and the conductive strips from stresses resulting from the deformations of the support member.

45 Claims, 12 Drawing Figures

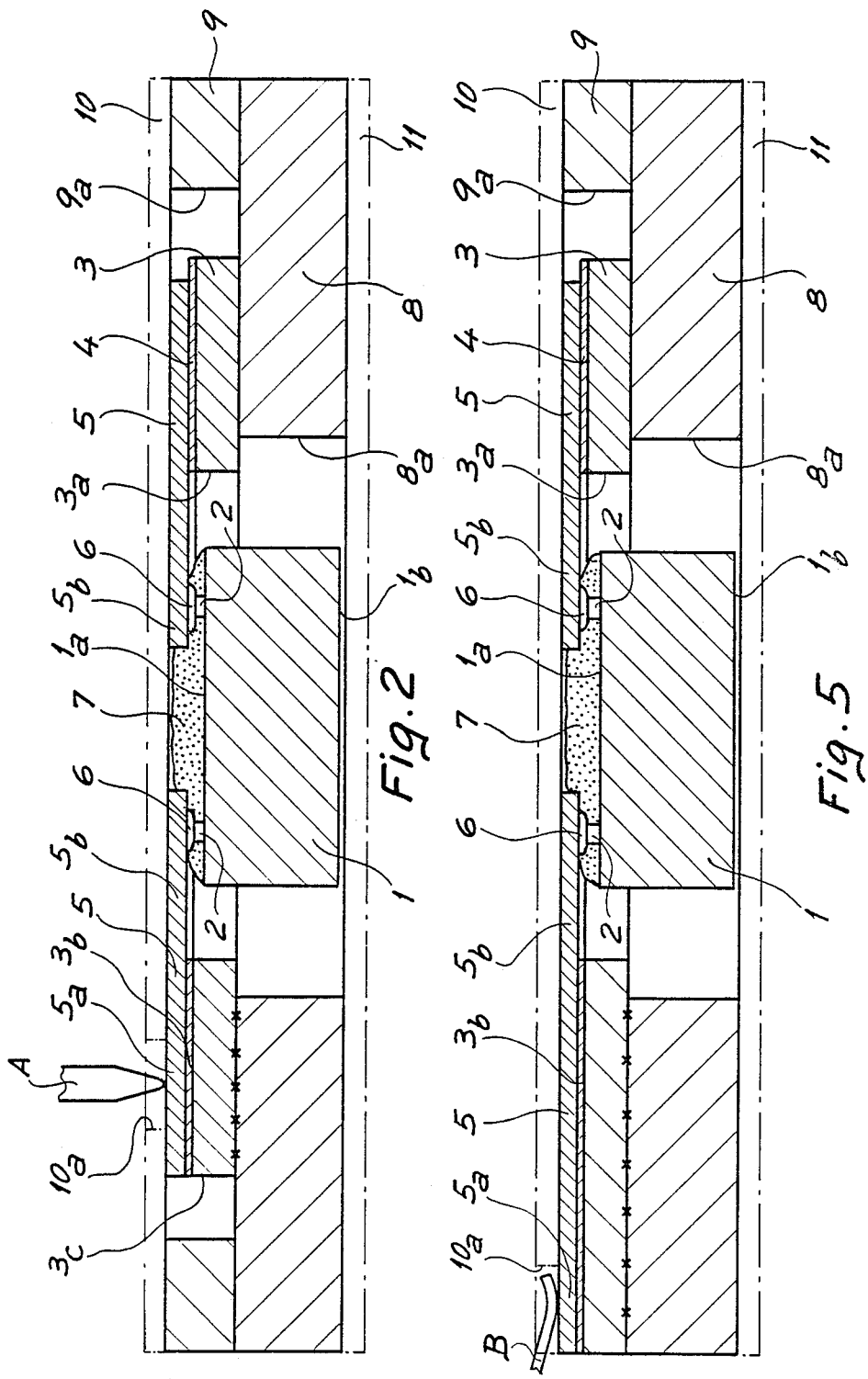

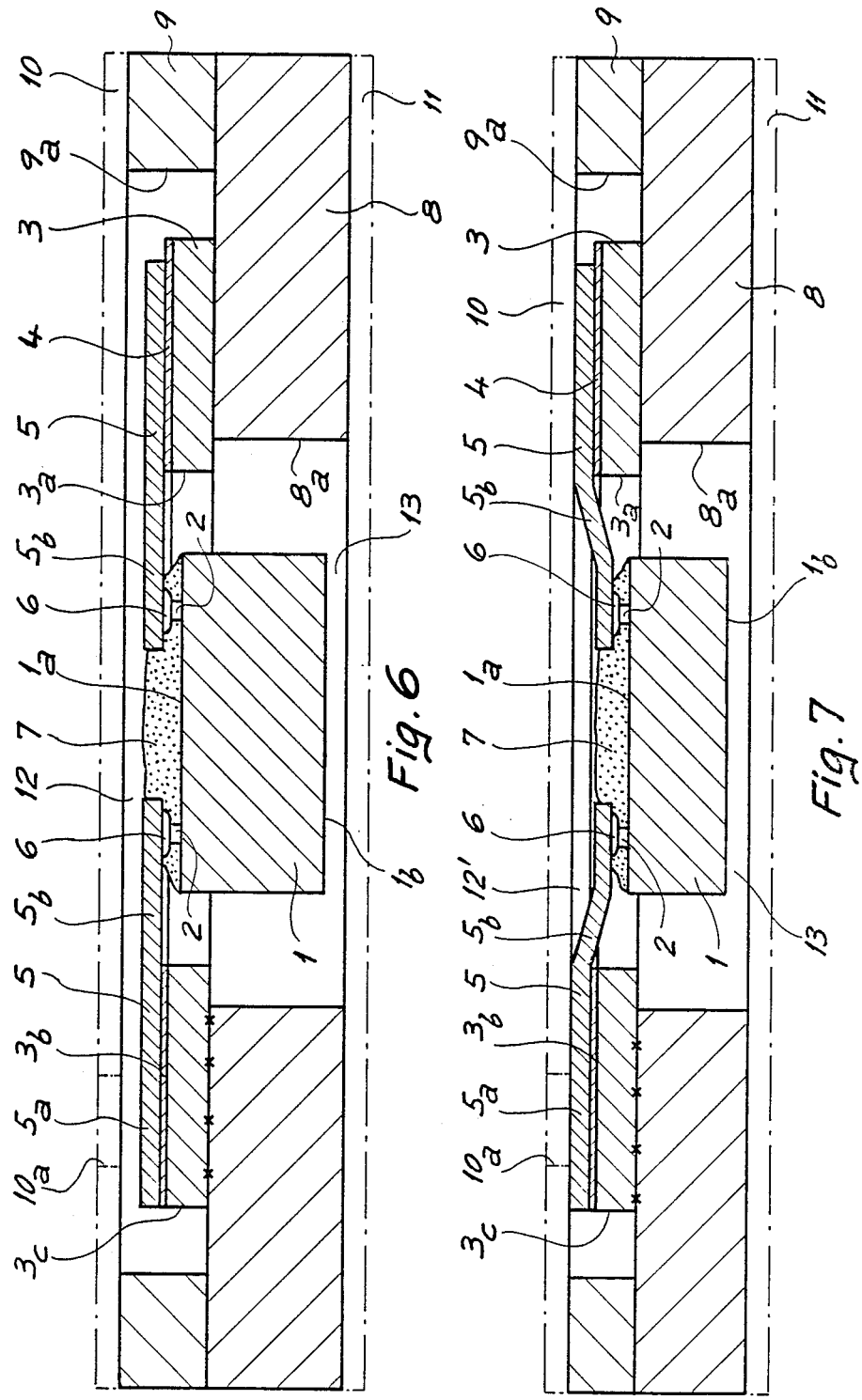

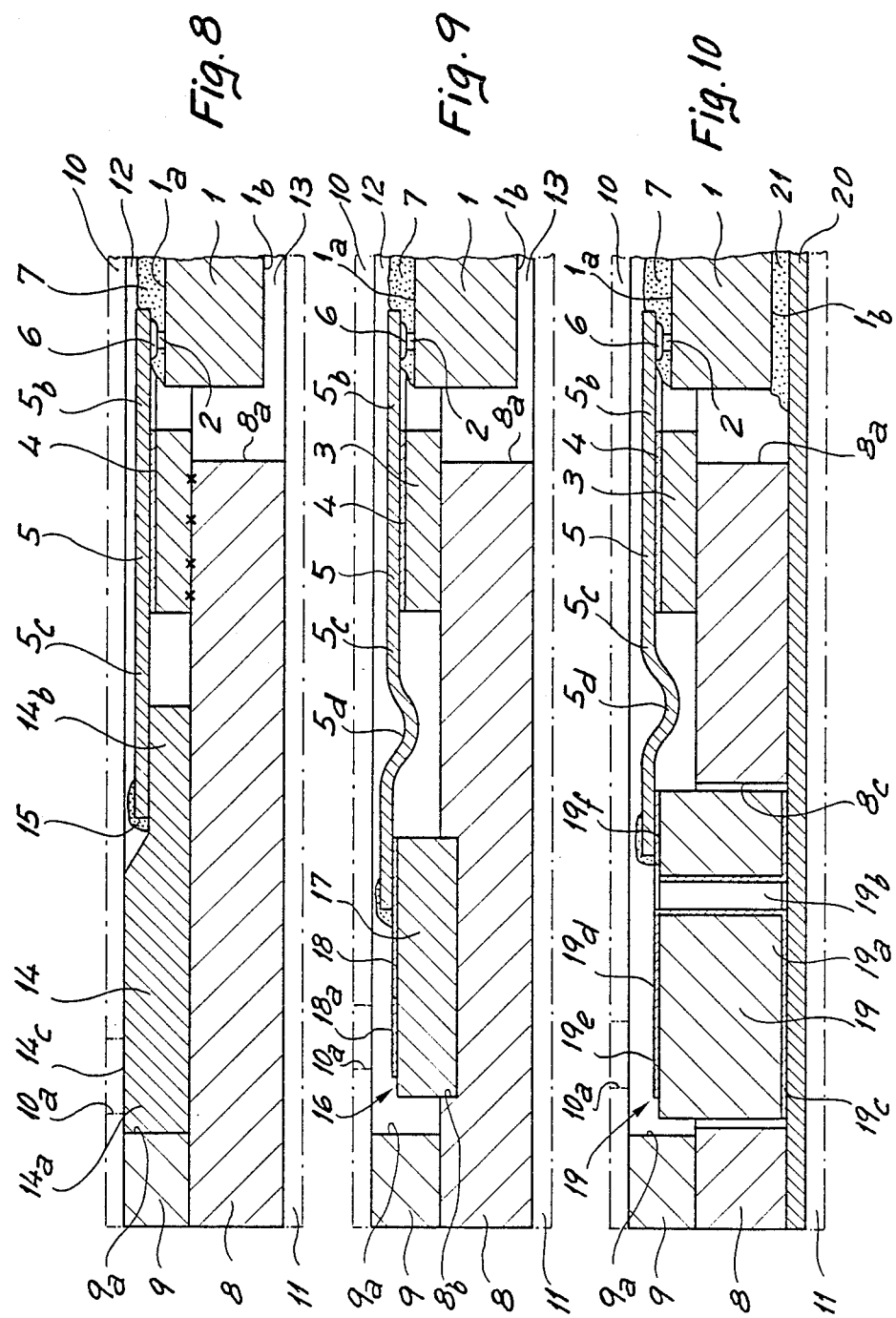

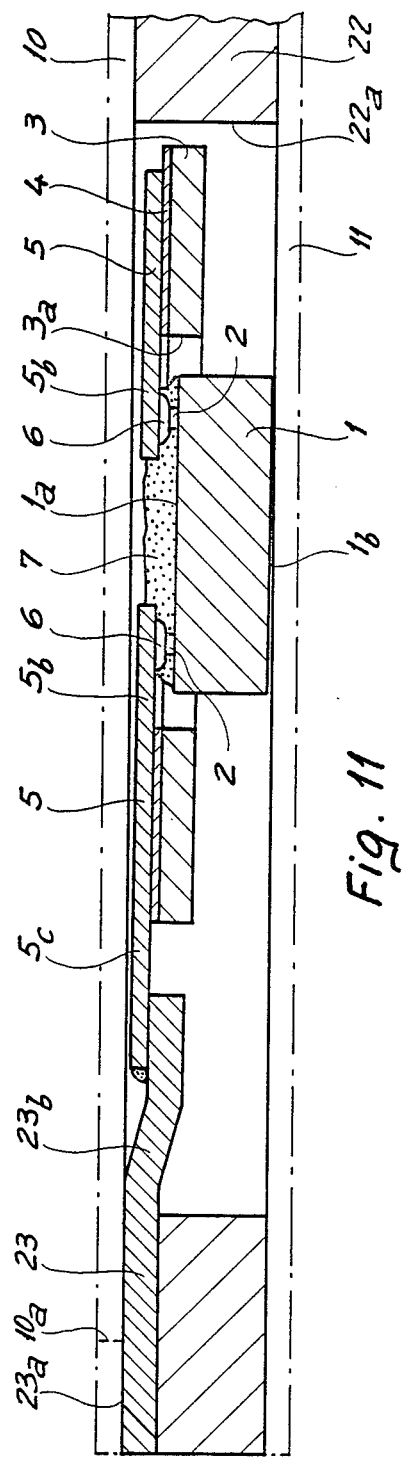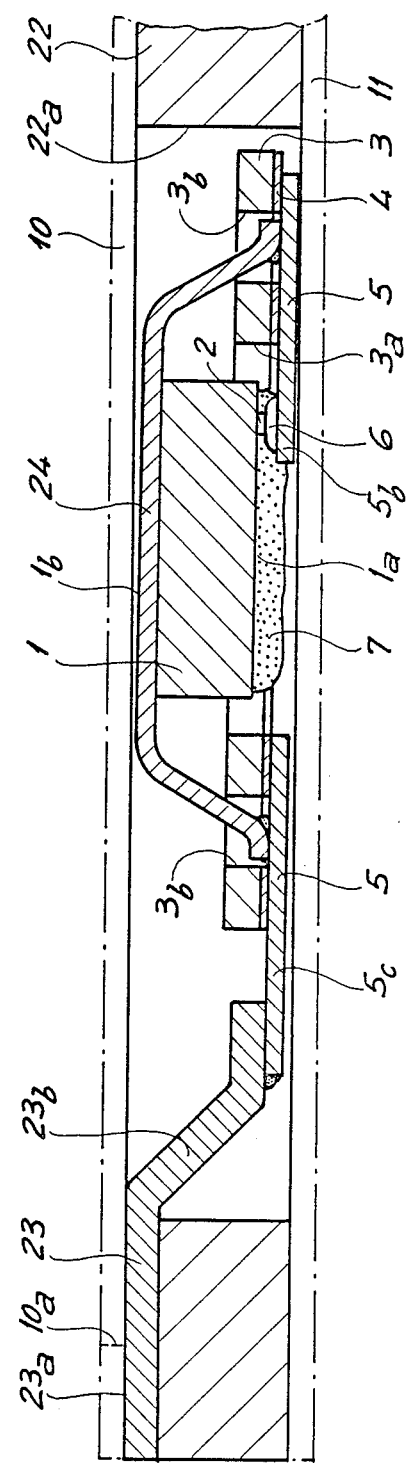

ELECTRONIC UNIT ESPECIALLY FOR MICROCIRCUIT CARDS AND CARD COMPRISING SUCH A UNIT

FIELD OF THE INVENTION

The present invention concerns a small electronic unit or module intended particularly for microcircuit cards such as credit cards, bank cards, car park cards, telephone call payment cards for public call boxes etc, since it is in this field that it is most useful at present, but for which other applications could also be found. For example the unit may be used in small devices where a display cell is controlled by an integrated circuit or in the sphere of automobile construction, where it is planned to introduce peripheral micro-processors into electrical connections which enable certain vehicle components, such as headlamps, to be supplied with power, the peripheral microprocessors being connected to a central microcomputer and operating to control and check the functioning of the said components.

DESCRIPTION OF THE PRIOR ART

As they are currently known, electronic units intended for transaction cards are generally in the form of a pellet to be incorporated in a corresponding opening situated in a corner of the body of the card and comprise an integrated memory and microprocessor in the form of a single chip or of two chips connected together by electric conductors, a set of contact areas, often numbering eight and connected only to the microprocessor, and an insulating body in which are embedded all the other elements excepting, of course, the conductive areas, which have to remain accessible to the connecting elements of an apparatus, for example a computer terminal, into which the card is designed to be inserted. In certain cases this insulating body, which defines the shape of the pellet and which ensures the protection of the elements which it surrounds, comprises a supporting part and a covering part; in other cases it is a homogeneous coating.

Moreover, irrespective of questions to do with the integrated circuit itself, such as, for example, what information the memory has to contain, what function the microprocessor must perform and how this memory and microprocessor have to be designed, the production of these electronic units poses a certain number of problems due to the somewhat numerous demands which they must meet.

First of all, a microcircuit payment card has to have the same format as a conventional, standardized card with magnetic tracks, such a card being 85 mm long, 54 mm wide and 0.76 mm thick (ISO standards), or at least have similar dimensions so as to remain easily manageable and unbulky.

If it is taken into account, firstly, that a thickness of 760 microns corresponds approximately to only twice that of an unprotected integrated circuit chip, secondly that the portion of the card's surface which can be allocated to the electronic unit is very limited given that the majority of it has to be kept for inscriptions such as the name of the person issuing the card, the identity of the bearer, a signature, information on use and, possibly, a photo and thirdly that the conductive areas must be large enough to ensure contact with the connecting elements of an apparatus, it is very easy to deduce that it is not feasible to use ready-coated or -encased, standardized circuits such as can at present be found on the market and which are too bulky.

It is therefore necessary, in the fabrication of electronic units, to start with bare integrated circuit chips, for the manufacturer himself to construct the network of interconnections which allows the chips to be electrically connected with the outside and to each other if there are several of them in one unit and to ensure the protection of the whole assembly, it naturally being very fragile especially at the junctions between conducting elements (connecting terminals of the chip, wires, etc.).

This protection must be all the more effective as the cards will inevitably be frequently subjected to a degree of deformation which may be considerable owing to the fact that these cards, like conventional cards, are expected to meet relatively rigorous standards or requirements of flexibility. Protection cannot therefore be afforded by making the electronic units as rigid as possible, because this could give to the zones in which the units are located a certain rigidity which would prevent the cards from fulfilling the said conditions of flexibility.

Finally is is quite clear that it must be possible to mass-produce these electronic units at very low cost.

SUMMARY OF THE INVENTION

The electronic unit according to the invention, comprises a support capable of being subjected to stresses which may lead to its deformation, at least one integrated circuit chip with connecting terminals and a set of electric conductors. First ends of the conductors are connected to the chip's connecting terminals, while the second ends are connected rigidly to the support. The chip is mounted on a flexible sheet of insulating material carried at least indirectly by the support, to which sheet there is attached at least a portion of each of the conductors. At least a fraction of the flexible sheet, including the zone where the chip is located and the majority of the part surrounding the chip, is devoid of any rigid connection with the support.

The flexible sheet thus has a certain amount of freedom which allows it not to follow or to follow only partially the movements of the support when the latter actually undergoes deformation, this making it possible, at least for the most part, to prevent the stresses to which the support is then subjected from being transmitted not only to the connections between the chip terminals and the conductors but also, as will subsequently be realized, to the conductors themselves, especially to the most fragile parts of them if they have any.

It is therefore an object of the present invention to provide an improved microcircuit and unit in which the integrated circuit chip or chips and the connecting conductors therefor are adequately protected.

It is a further object of the invention to provide a unit in which the integrated circuit chip or chips and the connecting conductors therefor are isolated from the stresses arising on flexure of the microcircuit card.

It is a still further object to provide such a unit which can be mass-produced at very low cost.

BRIEF DESCRIPTION OF THE DRAWINGS

Other characteristics and advantages of the electronic unit according to the invention will become apparent in the course of the following description of several possible embodiments which it can assume when it is intended particularly for incorporation in a microcircuit card. This description will be made with reference to the attached drawings in which:

FIG. 2 is a sectional view along the plane II—II of FIG. 1;

FIGS. 5 to 12 are complete or partial sectional views of eight other embodiments, those elements which are the same as those of FIGS. 1 and 2, apart from differences of dimension and shape, being indicated by the same reference numerals.

DESCRIPTION OF THE PREFERRED EMBODIMENTS

Figure 1:
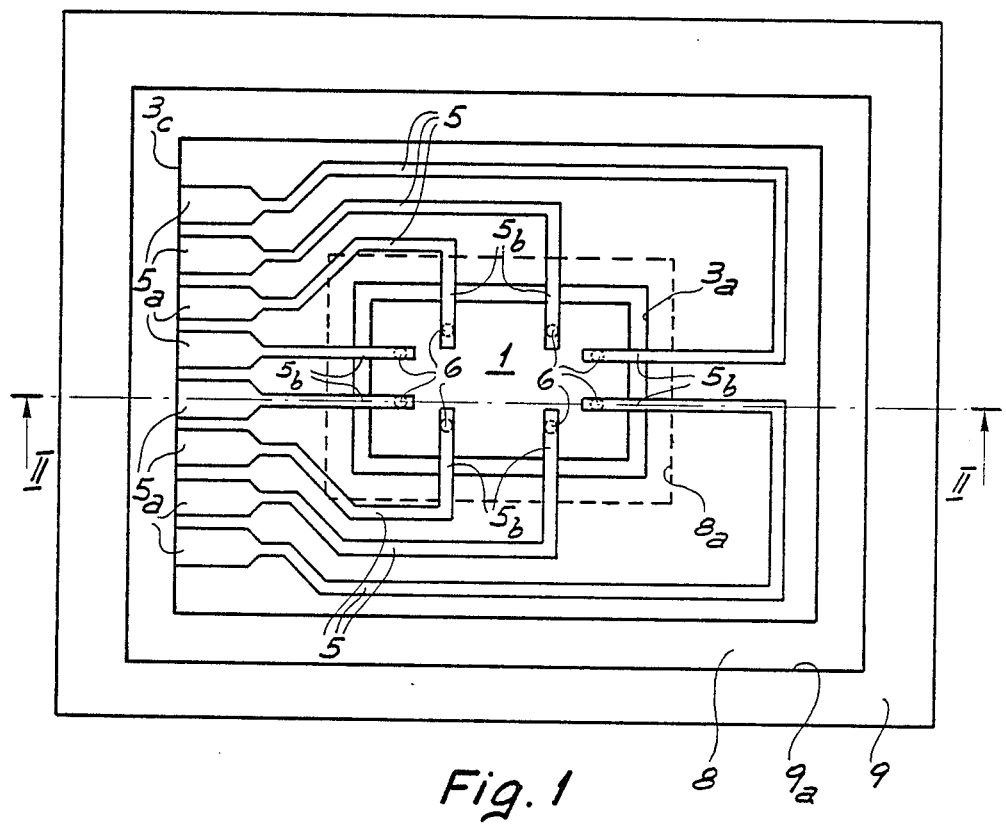
FIG. 1 is a plan view of the first of the said embodiments of the unit according to the invention.

As is shown in FIGS. 1 and 2, the electronic unit according to the invention comprises an integrated circuit chip 1 approximately parallelepipedic in shape which contains for example a memory and a microprocessor and whose front face $1_a$ is fitted with eight connecting terminals 2. As has already been indicated, this is the number of terminals generally provided for a credit card, but there could be more of them, or fewer.

This unit also comprises a rectangular flexible sheet 3 made of an electrically insulating material such as the polyester known by the Trade Mark "Mylar" or the polyimide marketed under the Trade Mark "Kapton" and having an opening $3_a$ which is also rectangular and whose length and width are slightly greater than those of the chip.

This sheet 3 has on its front face $3_b$, which is entirely covered with a fine layer 4 of an insulating material, for example a hardened adhesive, a network of eight conductive strips 5 which, at one end, each end in a contact area $5_a$ made of one piece therewith, and, at the other end, extend over the opening $3_a$ to form tags $5_b$ of straight profile whole ends are fixed onto the terminal 2 of the chip by conductive connections 5 which may be soldered joints or deposits of adhesive.

As is shown in FIG. 2, the connections 6 are embedded in a coating 7 of an opaque and relatively hard adhesive material, for example silicone, which totally covers the front face of the chip, rising approximately to the level of the upper surface of the tag $5_b$, and which, while protecting the integrated circuit against the light, prevents to a certain extent the stresses to which the tags may be subjected from affecting these naturally fragile connections.

As far as the intermediate layer 4 between the conductive strips 5 and the flexible sheet 3 is concerned, said intermediate layer 4 may be provided, for example, in order to improve the mechanical resistance of said sheet 3 or it may simply be the result of a necessary stage in the production of the conductive strips. It is also possible for it not to exist.

Furthermore, as will subsequently become apparent, the tags $5_b$, the thickness of which is obviously very slight (around 30 microns), do not only have an electrical role to play. They must also support the chip. It is therefore necessary for them to extend from at least two opposite sides of the opening $3_a$, otherwise the chip would not be connected sufficiently firmly to the sheet 3. This alone would be enough for the tags $5_b$ and their connections 6 with the chip terminals, despite the presence of the coating 7, to be subjected to stresses which might cause them to break.

It is in fact preferable, as FIG. 1 shows, to spread the tags as well as possible around the chip according to the positions of its connecting terminals, which positions are themselves more or less determined by the layout of the integrated circuit.

It should be noted that, for the same reason, it is advantageous for the distance between the chip and periphery of the opening in the sheet to be very small.

Finally, still on the subject of the conductors 5, it can be seen from FIG. 1 that all the contact areas $5_a$, which are clearly intended to receive the contact elements, for example pins, of the devices into which the card may be introduced, are arranged one beside the other along the same side $3_c$ of the sheet 3.

As can be seen more clearly from the cross-sectional view of FIG. 2, this sheet 3 is supported, together with all the elements it itself carries, by a rectangular base 8 of larger size made of a plate of plastics material and having an opening $8_a$ which is also rectangular and slightly larger than the opening $3_a$ on which it is approximately centred, the lower part of the chip being seated in said opening $8_a$.

In this embodiment the flexible sheet 3 is actually attached to the front face of the plate 8, by adhesive or by any other suitable method, but only by the fraction situated on the side of the opening $3_a$ where the contact areas $5_a$ are located, the rest of the sheet remaining totally free with respect to the plate. This attachment is indicated on the drawing by crosses.

Furthermore, the plate 8, which is of a thickness such that its rear face and that, $1_b$, of the chip are situated in approximately the same plane, also carries a frame 9 of the same material and the same outer dimension as itself.

This frame 9, which is fixed rigidly to the plate, for example by adhesive, and which surrounds at a distance the flexible sheet 3, is of a thickness approximately equal to the sum of the thickness of said sheet, the conductive strips 5 and the insulating layer 4 if its exists, such that its front face and those of the conductive strips located on the opposite side to the sheet are in approximately the same plane.

As regards the material of which the plate 8 and the frame 9 are constituted, said material is evidently chosen so that the card for which the electronic unit is intended is able to meet the demands of flexibility imposed upon it, and it is preferably the same as that which constitutes the body of the card which is itself very likely to be of polyvinyl chloride, often indicated by the abbreviation PVC.

Finally, there are also shown in FIG. 2, by broken lines, two films of plastic material 10 and 11, the first being spread across the front face of the frame 9 and provided with openings $10_a$ each located opposite a conductive area $5_a$, the other being applied to the rear face of the base plate 8 and sealing the opening $8_a$. These films, which are adhered or thermally applied to the plate and the frame, may be part of the module and be provided for example to afford temporary protection of the electronic unit between its manufacture and the moment when it is inserted into a card, or they may be films which totally cover the faces of the card.

From reading the above description it quickly becomes apparent that the electronic unit clearly enables the desired aim to be achieved.

In fact, the assembly comprising the chip 1, the flexible sheet 3 and the conductive strips 5 can easily be mass produced totally automatically by employing the technique usually indicated by the abbreviation T.A.B. of the English expression "tape automated bonding". Moreover, it is very simple to cut the base plate 8 and the frame 9 from sheets of plastics material of suitable thicknesses and then to assemble the whole, preferably after subjecting the contact areas $5_a$ to a galvanic treatment in order to improve their mechanical resistance to contact. The unit is thus inexpensive.

Furthermore, the number of fragile connections between conductive parts, such as soldered or adhered joints, is optionally limited given that the conductive strips 5 allow the chip terminals to be connected directly with the outside.

On the other hand, when the support formed by the plate 8 and the frame 9 is subjected to deformation, the free part of the flexible sheet 3 will be able to slide over the plate and possibly even part from it in places if the upper protective film 10 allows. Because the chip is loose in the opening $8_a$, which is sufficiently large for this to be so, there will be practically no force exerted parallel to the sheet on the tags $5_b$ and the connections 6 with the connecting terminals, except those forces which may result from the rubbing, which it will evidently be sought to minimize, of the sheet against the base plate, of the conductors 5 against the film 10 and possibly of the rear chip face against the film 11 if these are in contact.

In addition, it is easy to see from FIG. 2 that when the plate 8 is forced to bend upwards the protective film 10, which is obviously very flexible and more or less elastic, will only very slightly oppose the tendency which the sheet 3 and the conductive strips 5 will exhibit to remain flat, especially if the other film 11 can push the chip 1 upwards. When, on the other hand, the plate curves downwards. the film 10 will exert pressure on the conductors which will help these and the sheet to remain flat. Consequently, if the sheet and conductive strips are subjected to bending this will be slight, and in any case the films 10 and 11 will exert pressures in the opposite direction respectively on the tags $5_b$ and the rear chip face, which pressures will tend to keep the ends of said tags applied to the connecting terminals 2.

Finally, as the opening $3_a$ in the sheet 3 is smaller than that, $8_a$, in the plate, that part of the sheet which projects over the opening $8_a$ can accompany the bending of the tags $5_b$ while reducing its scale, a fact which enables the risk of the conductive strips breaking at the inner edge of the sheet to be restricted to a very great extent. Clearly, this would not be the case if the opening in the sheet had dimensions equal to or greater than those of the opening in the plate.

Figure 3:
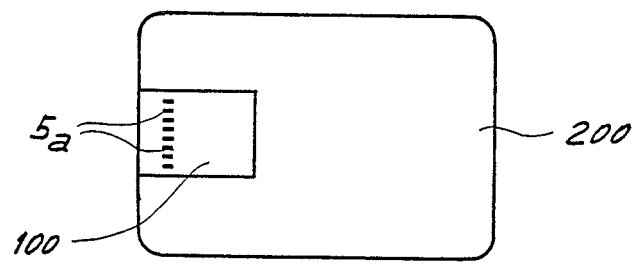
FIGS. 3 and 4 show diagrammatically how the unit of FIGS. 1 and 2 can be positioned in a microcircuit card.
Figure 4:
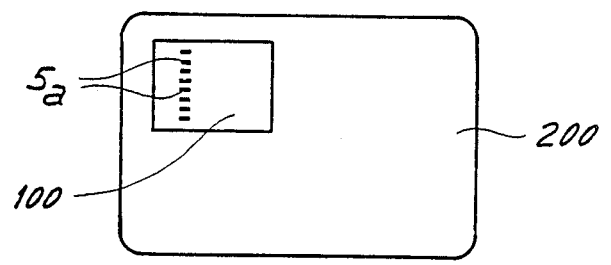

FIGS. 3 and 4 show two possible ways of inserting the electronic unit which has just been described and to which is allocated the reference numeral 100 into a transaction card. In these Figures only the outline of the unit and the accessible part of the contact areas $5_a$ are shown.

In FIG. 3 the unit is located in a slot of the same shape and dimensions provided approximately in the middle of the left-hand side of the body 200 of the card, while in FIG. 4 the unit is positioned in the more usual manner in an opening situated in the upper left-hand corner of the body.

In both cases, the unit is naturally of the same thickness as the card body, to which it can be firmly connected by punching, adhesion or any other suitable method, and its other dimensions are sufficiently small to leave space on the face or faces of the card for inscriptions such as have already been mentioned above and possible for magnetic tracks.

Depending on whether or not the electronic unit already includes protective films of plastics material, it is either desirable or necessary to provide at leat two such films totally covering each face of the card with the exception of the contact areas.

The embodiment shown in FIGS. 1 and 2 is appropriate when the connecting elements of the devices into which the card is designed to be introduced are of the pointed type such as the one, A, shown diagrammatically in part in FIG. 2.

FIG. 5 shows, in cross-section similar to that of FIG. 2, an embodiment of the electronic unit according to the invention intended for connecting elements of the sliding type such as the one, B, shown schematically in the Figure.

The only differences between this embodiment and the preceding one are that the frame 9 is U-shaped and open at the side where the contact areas $5_a$ are located, that, at this side, the edge of the flexible sheet 9 is aligned with that of the plate and finally that as a result of this the openings $10_a$ (see FIG. 2) in the film 10 have been converted into notches.

In this case, obviously, the electronic unit must be positioned along the edge of the card, for example in the position which it occupies in FIG. 3.

As has been shown, in the embodiment of FIGS. 1 and 2 the deformation to which the sheet 3 and conductors 5 are subjected following that which the support 8, 9 suffers is slight, as are the stresses imposed on the tags $5_b$ and their connections 6 with the chip terminals 2.

A simple method of reducing still more the stresses suffered by the tags and to eliminate them almost completely for the connections is, as is shown in FIG. 6, to give the base plate 8 and the frame 9 thicknesses which allow a space 12 to be left between the conductive strips 5 and the protective film 10 and another 13 between the film 11 and the rear face $1_b$ of the chip 1.

Thanks to this the loose part of the sheet 3 can not only slide over the plate 8 but also part from it at will, and the chip is totally free to follow these movements.

Of course, the thicknesses of the plate and the frame are selected according to the demands of flexibility imposed on the card, in such a way that the chip and the sheet with the conductive strips 5 can practically never touch the films 11 and 10 respectively, at least as long as the card is not subjected to deformation greater than that which corresponds to these demands.

In this way the connections 6 will not be subjected to stresses other than those resulting from the weight of the chip and only the tags $5_b$ located at the side where the sheet is fixed to the base plate will occasionally suffer slight deformation.

In addition, given that the chip's rear face is no longer in contact or almost not in contact with the film 11, the chip is better protected.

FIG. 7 shows an intermediate embodiment between that of FIG. 2 and that of FIG. 6.

In this embodiment the frame 9 is, as was the first one to be described, of a thickness approximately equal to the sum of the thicknesses of the sheet 3, the conductive strips 5 and possibly also the insulating layer 4 which covers the sheet, but the tags $5_b$ have been folded into a "Z" shape, so that their ends fixed to the terminals 2 of the chip are inside the opening $3_a$ in the sheet and there remains a free space 12' between at least part of these tags and the film 10.

Furthermore, the space 13 between the chip and the film 11 seen in the embodiment of FIG. 6 is also present here.

In this case the tags $5_b$ will be subjected to slight stresses, in the zone near the edge of the opening $3_a$ in the sheet, but the connections 6 will not. These stresses can be minimized if it is arranged that the first bend in the tags $5_b$, that is to say that which is furthest from the chip terminals, be located approximately at the periphery of the opening $3_a$ in the sheet.

The three embodiments of the unit according to the invention which will now be described are obtained simply by bringing about a certain number of modifications to that of FIG. 6. This is the reason why the entire unit has not been shown in FIGS. 8 to 10, but only the part showing these changes, and why we shall only point out the differences between these embodiments and those of FIG. 6 or even only between the embodiments of FIGS. 8 to 10 as certain modifications are common to all three.

FIG. 8 shows an embodiment which could be used if it turned out that, for certain uses of the card which the electronic unit is to equip and even after being subjected to galvanic treatment, the contact areas located on the flexible sheet discussed thus far do not provide sufficient mechanical resistance to contact to be reliable.

In this embodiment the contact areas $5_a$ are done away with and the conductive strips 5 extend beyond the outer edge of the flexible sheet 3, while retaining a straight profile, to form tags $5_c$ approximately parallel to each other and which will be described as "external" as opposed to the tags $5_b$ which may be termed "internal".

Moreover, the unit comprises eight metal strips 14 of a thickness approximately equal to the width of the conductive strips 5. which were originally in the shape of a rectangle of width equal to the height of the frame 9 but which have been cut at one corner so as to have a wide section $14_a$ and a narrow section $14_b$ of a width approximately equal to the thickness of the flexible sheet 3, plus possibly that of the insulating layer 4, and which are each sandwiched rigidly between two plates of insulating material having the same form as them, in such a way as to form a block of a structure similar to that of the connectors known by the Trade Mark "Zebra".

This block, of which FIG. 8 shows only one of the strips 14 but which can very easily be imagined, is fixed by adhesion to the base plate 8 and possibly to the frame 9 to whose inner wall it is applied in such a way that the narrow parts $14_b$ of the strips 14, which are of course perpendicular to the plate 8, are positioned under the ends of the external tags $5_c$, said ends being fixed to the edges of the strips 14 by soldering or by accumulations of conductive adhesive 15.

In this case, an opening $10_a$ in the protective film 10 is placed over that part $14_a$ of each strip with which it is in contact, it being edge portions $14_c$ of these strips which act as areas of connection with the outside.

The embodiment of FIG. 9 differs from that of FIG. 8 in that, firstly, the insulating sheet 3 is no longer fixed at all to the base plate 8, secondly, the external tags $5_c$ no longer have a straight profile but a part folded into a "U" and, thirdly, the block formed by conductive strips and insulating plates is replaced by a rectangular printed-circuit board 17 with a network of conductive tracks 18 isolated from one another to which are fixed, at one end, the ends of the external tags $5_c$ and which, at the other end, terminate in contact areas $18_a$ positioned next to each other in a direction perpendicular to the Figure, under the openings $10_a$ in the protective film 10. Depending on its thickness the board 17 can either simply be adhered to the base plate 8 or partially embedded in and adhered to seat $8_b$ in the plate.

There are various reasons which may lead to the choice of this embodiment.

First of all, it may be chosen because it allows almost total elimination of the stresses to which certain internal tags $5_b$ could still be subjected in the case of the unit of FIG. 6, as here it is no longer only a fraction of the sheet 3 surrounding the majority of the chip's periphery which can slide over and part from the plate 8 but the entire sheet, owing in particular to the presence of the folds $5_d$ which, moreover, make it possible for there no longer to be any great risk of the external tags $5_c$ and their fastenings to the tracks 18 of the printed circuit suffering from the said movements of the sheet.

It is also possible to make use of this embodiment when the unit has to have contact areas of particularly large dimensions and when it is not in the manufacturer's interest consequently to increase the surface of the flexible sheet, for example because of the relatively high cost of materials such as "Kapton" or because it would not be economic to provide special equipment for manufacturing units of this type.

The same would be true if not the size but the number of contact areas had to be increased.

Finally, it is worth noting that if, instead of completing FIG. 9 with the right-hand part of FIG. 6, the unit were simply made symmetrical, the unit would then have contact areas on both sides of the chip, as is generally the case in the payment cards already in existence. Of course, if such a unit were fabricated, the network of conductive strips on the sheet 3 would have a different configuration and, in the example selected where the chip comprises eight connecting terminals, there would be only four contact areas $18_a$ and four external tags $5_c$ on each side.

FIG. 10 shows an embodiment suitable for when the integrated circuit substrate has to be grounded, this connection being made by the rear face of the chip.

As before, the insulating sheet 3 is free with respect to the base plate 8 and the external tags $5_c$ have U-shaped bends, but the simple printed circuit 17 of FIG. 9 is replaced by a double-faced printed circuit 19 seated in a second opening $8_c$ in the plate $8_a$. This printed circuit 19 comprises an insulating board $19_a$ having a hole $19_b$, eight conductive tracks $19_f$ with respective contact areas, these all being on the front face of the board and having attached to them the ends of the tags $5_c$, and a metal coating $19_c$ which totally covers the rear face of the board and the wall of the hole $19_b$ but which, on the front face of said board, only forms a conductive track $19_d$ which joins that of the other eight tracks which is connected to the integrated circuitground terminal or directly the appropriate contact area $19_e$.

Furthermore, the electrical connection between the metal coating $19_c$ and the rear face of the chip is ensured by a thin metal sheet 20 to which is fixed the printed circuit 19, by means of a conductive adhesive, and which covers the whole of the rear face of the base plate 8 to which it is firmly connected, and by a layer of conductive adhesive 21 which adheres both to the sheet 20 and to the rear face $1_b$ of the chip, this sheet being covered in turn by the protective film 11.

In this particular embodiment the chip 1 is therefore practically fixed in relation to the support, but given that the insulating sheet 3 can move in its entirety, the internal tags $5_b$ and their connections 6 with the connecting terminals 2 of the chip will only suffer stresses comparable to those to which they may be subjected in the case of the embodiment of FIGS. 1 and 2.

In the embodiment shown in FIG. 11 the support is no longer formed of a base plate and a frame but of a single plate 22 the thickness of which is equal to or very slightly greater than the height of the assembly comprising the chip 1, the flexible sheet 3 and the conductive strips 5 and which has a rectangular opening $22_a$ which is larger than the sheet and in which said assembly is seated in its entirety. Furthermore, the conductive strips 5 form external tags $5_c$ of straight profile beyond the edge of the sheet 3, the ends of which tags $5_c$ are each soldered or adhered to one of the Z-shaped tags $23_b$ formed in the opening $22_a$ by other, thicker conductive strips 23 which end in contact areas $23_a$ and which are fixed to the plate 22, this latter having a hollow or several channels to receive them.

The situation here is, therefore, that the sheet 3 is not directly carried by the support, but through the intermediary of conductors which connect the contact areas to the chip terminals and which are no longer homogeneous but each formed of a conductive strip 5 and a conductive strip 23.

In this embodiment are assembled several of the advantages of the preceding embodiments. The thickness of the unit is reduced to the minimum, the contact areas have good mechanical resistance and may be large without the flexible sheet also being large, and the stresses suffered in the event of plate deformation by the internal and external tags of the conductive strips 5 and their connections with, respectively, the chip terminals and the conductive strips 23 can only be very weak as they are the result merely of pressure exerted by the protective films 10 and 11.

Of course, it would be possible to do away with the conductive strips 23 and to extend those carried by the sheet 3, but only on condition that the latter strips be sufficiently resistant for there not to be a risk of their breaking especially at the edge of the opening $22_a$ in the plate.

The embodiment of FIG. 12, which, like that of FIG. 10, is intended for situations where the substrate of the integrated circuit has to connected to the integrated circuit's earth, differs only in two ways from the preceding embodiment.

The first difference is that the assembly comprising the chip, the sheet and the conductive strips 5 is positioned so that the chip's rear face $1_b$ is on the same side of the support as the contact areas $23_a$. It could, however, perfectly well have been positioned as in FIG. 11, the reverse also being true.

The second difference is that said assembly is equipped with an additional, U-shaped conductive strip 24 the base of which is in direct contact with the rear face of the chip or connected to it by a layer of conductive adhesive and the lateral arms of which extend into two holes $3_b$ in the flexible sheet 3 where their ends are soldered or adhered under the metal strip 5 whose internal tag $5_b$ is fixed to the chip's ground terminal.

This additional strip, which also constitutes as it were a safety ring for protecting the circuit from an electrostatic point of view, may also for example be as thin as the strips 5 so that its presence does not cause any notable increase in the thickness of the unit. As far as its width is concerned, this can range from that of the strips 5 or even smaller to the length or width of the chip depending on the direction in which it is positioned.

In certain variants the additional strip could be replaced by an L-shaped strip or a wire which would not necessarily extend from one end of the chip to the other and which, if it was not desirable to provide a special hole in the sheet, could have its end fixed to a point situated on the external tag $5_c$ of the strip 5 connected to the circuit's earth or even on the tag $23_b$ of the strip 23 connected to said tag $5_c$.

It is perfectly clear that it would be possible, without going beyond the scope of the invention, to find many other possible embodiments for the unit according to the invention and numerous variants of those which have been described, all the more since, as has already been said, the unit could be useful in fields other than microcircuit cards.

For example, it is unnecessary for the support and its opening or openings, the flexible sheet and its opening etc. to be rectangular in shape. The unit could also be circular in shape and for certain uses could even not be flat but, for example, semi-cylindrical. Furthermore, it would be possible, at the same time as covering the chip's front face with opaque, adhesive material, to fill the space between the chip and the periphery of the opening in the flexible sheet with the same material in order to relieve the internal tags, or otherwise to fill the space surrounding the chip and, when it exists, that which is located below the chip with an insulating, adhesive and sufficiently soft material, such as certain silicones, only to hamper the chip very slightly in its movements, this having the same advantage and, in addition, affording better protection to the chip.

It would also be perfectly possible for the flexible sheet not to carry a single integrated circuit chip but two or more, mounted in the same way, connected to each other and one at least of which would be connected to contact areas.

As far as the sheet is concerned, mention has been made of the reasons why it is preferable, when it is carried directly by a base plate, for it to project over the opening in the plate, but this is not obligatory, however.

The impression has been given that it is a good idea, for reasons of mechanical resistance and of reliability, for the conductors connecting the chip to the outside, or, if there are several chips, at least one of them to the outside and all of them to each other, to be as non-heterogeneous as possible, in order to optimally restrict the number of soldered or adhered joints. However, this does not mean that it would be impossible to replace each of the conductive strips connected to the flexible sheet and mentioned in the description by a conductive track on the flexible sheet, a tag or wire being soldered or adhered on the one hand to the track and on the other to a chip terminal.

Furthermore, there would be no disadvantage in substituting for the base plate and frame, when they exist, a homogeneous support of the same material made, for example, by stamping.

It is not essential, moreover, for the flexible sheet to have an opening. It could be solid and carry conductive tracks to which would be fixed the chip terminals. In this case, it would obviously be necessary, in order to achieve the desired aim, for the area of the sheet situated under the chip and at least the majority of the area surrounding the chip not to be rigidly connected to the support.

Finally, it is useful to underline the fact that it would not be beyond the scope of the invention for the support to be of one piece with the card body.

I claim:

1. An electronic unit comprising a support capable of being subjected to stresses tending to deformation of said support, an integrated circuit chip with a front face provided with connecting terminals and a rear face, a set of electric conductors each having a first end conductively connected to a corresponding one of said connecting terminals and a second end connected rigidly to said support, and a flexible sheet of insulating material, said chip being mounted to said flexible sheet, said flexible sheet being carried at least indirectly by said support, at least a portion of each of said conductors being fixed to said sheet of which at least a fraction, comprising the zone in which said chip is located and an area consisting in total of a major sector of the area surrounding said chip, being devoid of any rigid connection with said support.

2. An electronic unit according to claim 1, wherein said flexible sheet rests on said support.

3. An electronic unit according to claim 2, wherein said second ends of said conductors are all on the same side of said chip and a part of said flexible sheet situated on the same said side of said chip is connected rigidly to said support.

4. An electronic unit according to claim 3, wherein said second ends of said conductors are located on the part of said sheet which is rigidly connected to said support and constitute part of the conductor portions fixed to said sheet.

5. An electronic unit according to claim 2, wherein said second ends of said conductors are situated beyond said sheet, the whole of said sheet is devoid of any rigid connection with said support and said conductors have bends between their second ends and said sheet.

6. An electronic unit according to claim 5, wherein that said chip is firmly connected to said support and is joined to said sheet by free portions of said conductors.

7. An electronic unit according to claim 1, wherein said second ends of said conductors are situated beyond the sheet and said sheet is carried by said support through the intermediary of said conductors.

8. An electronic unit according to claim 2, for use in a microcircuit card and further including contact areas fixed in relation to said support, connected to respective second ends of said conductors and accessible to in apparatus into which the card is designed to be inserted, wherein said flexible sheet has a first opening the periphery of which surrounds said connecting terminals of said chip; said conductors extending in the form of internal tags in the direction of the chip and beyond the periphery of the opening in the sheet, each of said first ends being fixed to one of said chip's connecting terminals; and wherein said support comprises a generally flat base with a front face on which said sheet is positioned and a rear face approximately parallel with the front and rear faces of said chip and having a second opening situated below said first opening in said sheet, the periphery of which second opening surrounding said chip at a distance; further comprising a frame connected rigidly to said base, said frame having an approximately flat front face parallel with said base and on the opposite side from said base and at least partially surrounding said sheet and said conductors at a distance, wherein said base and frame are of thicknesses such that said chip, said sheet and said conductors are seated in their entirety in the space between the planes in which are situated the front face of said frame and the rear face of said base.

9. An electronic unit according to claim 8, wherein the second ends of the conductors are all located on the same side of the chip and that a fraction of the flexible sheet situated on this side of the chip is connected rigidly to the base.

10. An electronic unit according to claim 9, wherein said contact areas are located on the part of said sheet which is rigidly connected to said base and that, between said contact areas, in which said conductors terminate directly, and the periphery of said first opening in said sheet, said conductors are entirely fixed to said sheet.

11. An electronic unit according to claim 10, wherein said conductors are formed of homogeneous metal strips made in one piece with said contact areas.

12. An electronic unit according to claim 11, wherein those faces of said conductive strips which are situated on the opposite side from said flexible sheet are in approximately the same plane as the front face of said frame.

13. An electronic unit according to claim 12, wherein said base of said support is of a thickness such that the rear face of said chip is in approximately the same plane as the rear face of said base.

14. An electronic unit according to claim 12, wherein said base of said support is of a thickness such that there exists a space between the rear face of said chip and the plane in which the rear face of said base is situated.

15. An electronic unit according to claim 11, wherein said base and said frame of said support are of thicknesses such that there exists spaces between those faces of said conductive strips which are situated on the opposite side from said flexible sheet and the plane in which is located the front face of said frame and between the rear face of said chip and the plane in which is located the rear face of said base.

16. An electronic unit according to claim 12, wherein said internal tags retain a straight profile above said first opening in said flexible sheet.

17. An electronic unit according to claim 13, wherein said internal tags are folded so that the first ends of said conductive strips are separated from the plane in which is situated the front face of said frame.

18. An electronic unit according to claim 8, wherein said flexible sheet and said base and said frame of said support are rectangular in shape, said frame has an outer edge which coincides with that of said base and said contact areas are arranged adjacent to each other along one side of said sheet.

19. An electronic unit according to claim 18, wherein said frame totally surrounds said flexible sheet.

20. An electronic unit according to claim 18, wherein said side of said sheet along which said contact areas are arranged coincides approximately with the edge of said base and said frame is arranged around the other three sides of said sheet.

21. An electronic unit according to claim 9, further comprising a plurality of metal strips equal in number with said conductors, arranged approximately perpendicularly to said base and separated from each other by plates of insulating material to which they are firmly connected, the assembly formed by said strips and plates being fixed to the front face of said base; said conductors extending, in the form of external tags, beyond said flexible sheet with their second ends fixed to respective parts, situated on the opposite side from said base, of the edges of said strips; and other parts of the edges of said strips forming said contact areas.

22. An electronic unit according to claim 8, further comprising a board of electrically insulating material connected rigidly to said base of said support and having a front face to which are fixed said contact areas and a set of conductive tracks each ending in one of said contact areas and a rear face; said conductors extend beyond said flexible sheet, in the form of external tags, with respective ones of their second ends fixed to said conductive tracks; the whole of said sheet being devoid of any connection with said base; and said external tags having bends.

23. An electronic unit according to claim 22, wherein said board is fixed to the front face of said base of said support.

24. An electronic unit according to claim 22, wherein said board carries on its rear face a metal layer connected electrically to one of said contact areas and is seated in an additional opening in said base of said support so that said metal layer is in approximately the same plane as the rear face of said base, and said unit additionally comprises a metal sheet which covers said rear face of said base to which it is firmly connected, said metal sheet being in electrical contact with said metal layer and connected electrically to the rear face of said chip by a layer of conductive adhesive.

25. An electronic unit according to claim 8, wherein said first opening in said flexible sheet is smaller than said second opening in said base of said support, so that said sheet projects over said second opening.

26. An electronic unit according to claim 8, wherein said base and said frame are two pieces joined together.

27. An electronic unit according to claim 26, wherein said frame is adhered to said base.

28. An electronic unit according to claim 8, wherein said frame is made in one piece with said base.

29. An electronic unit according to claim 7, for use in a microcircuit card and having contact areas fixed in relation to said support, connected to respective second ends of said conductors and accessible to an apparatus into which the card is designed to be introduced, wherein said support includes an approximately flat plate provided with an opening larger than said sheet and sufficiently thick for said chip, said sheet and the parts of said conductors which are not connected rigidly to said plate to be seated in said opening in their entirety.

30. An electronic unit according to claim 29, wherein said sheet has an opening the periphery of which surrounds the connecting terminals of said chip and said conductors extend, in the form of internal tags, in the direction of the chip and beyond the periphery of said opening in said sheet, wherein their first ends fixed to the terminals of said chip.

31. An electronic unit according to claim 30, wherein each said conductor comprises a first, approximately flat metal strip which is fixed to said sheet, which forms one of said internal tags and which also extends beyond the outer edge of said sheet to form an external tag, and a second, thicker metal strip which is fixed to said plate and which extends beyond the periphery of said opening in said plate in the form of a tag to the end of which is fixed the end of the external tag of said first strip.

32. An electronic unit according to claim 31, wherein said tags of said second metal strips are folded so as to penetrate into the opening in said plate and said plate is of a thickness approximately equal to the height of the assembly comprises said chip, said sheet and said first metal strips.

33. An electronic unit according to claim 31, further comprising an additional metal strip which electrically connects the rear face of said chip to said first metal strip which is connected to the ground terminal of said chip.

34. An electronic unit according to claim 33, wherein said additional metal strip is in the form of a "U" the base of which is in electrical contact with said chip and the lateral arms of which extend into two holes in said sheet with their ends fixed under said first metal strip which is connected to the ground terminal of said chip.

35. An electronic unit according to claim 34, wherein said tags of said second metal strips are folded so as to penetrate into said opening in said plate and said plate is approximately equal in thickness to the height of the assembly comprising the said chip, said first metal strips and said additional metal strip.

36. An electronic unit according to claim 31, wherein said sheet is approximately rectangular and all said external tags of said first metal strips are located on the same side of said sheet.

37. An electronic unit according to claim 8, wherein said conductive connections between said connecting terminals of said chip and the first ends of said conductors consist of soldered joints.

38. An electronic unit according to claim 8, wherein said conductive connections between said connecting terminals of said chip and the first ends of said conductors are embedded in a coating of hard, opaque, adhesive material which covers the whole of the front face of said chip.

39. An electronic unit according to claim 8, wherein said flexible sheet is covered by an intermediate layer of adhesive material positioned under said conductors.

40. An electronic unit according to claim 8, additionally comprising two protective films of plastics material fixed respectively to the front and back of said support, the film located at the front being cut away opposite said contact areas.

41. An electronic unit according to claim 8, wherein said support is of plastics material.

42. An electronic unit according to claim 41, wherein said support is of polyvinyl chloride.

43. A microcircuit card comprising an electronic unit with a support capable of being subjected to stresses tending to deformation of said support, an integrated circuit chip having a front face provided with connecting terminals and a rear face, a set of electric conductors each having a first end conductively connected to a corresponding one of said connecting terminals and a second end connected rigidly to said support, and a flexible sheet of insulating material carried at least indirectly by said support, wherein said chip is mounted to said sheet at least a portion of each of said conductors being fixed to said sheet of which at least a fraction, comprising the zone in which said chip is located and the majority of the area surrounding said chip, is devoid of any rigid connection with said support, said unit moreover including contact areas fixed in relation to said support, connected to respective second ends of said conductors and accessible to an apparatus into which the card is designed to be inserted, wherein said flexible sheet has a first opening the periphery of which surrounds said connecting terminals of said chip; said conductors extend in the form of internal tags in the direction of the chip and beyond the periphery of the opening in the sheet, each of their first ends being fixed to one of said chip's connecting terminals; said support comprises a generally flat base having a front face on which said sheet is positioned and a rear face approximately parallel with the front and rear faces of said chip and provided with a second opening situated below said first opening in said sheet, the periphery of which second opening surrounding said chip at a distance, and a frame connected rigidly to said base, said frame having an approximately flat front face parallel with said base and on the opposite side from said base and at least partially surrounding said sheet and said conductors at a distance; and wherein said base and frame are of thicknesses such that said chip, said sheet and said conductors are seated in their entirety in the space between the planes in which are situated the front face of said frame and the rear face of said base.

44. A microcircuit card according to claim 43, wherein said support is constituted by a body of plastics material forming said card.

45. An electronic unit useful for mounting an integrated circuit in a thin, flexible medium such as a credit card or the like, comprising:
   an integrated circuit chip having a plurality of electrical terminals positioned on one side thereof;
   a flexible sheet of insulating material having an aperature therein for receiving said chip;
   a plurality of electrically conductive strips attached to said sheet and each having a first end extending into said aperature for making electrical contact with corresponding ones of said terminals and a second end, said extending portions of said strips being physically bonded to said corresponding terminals for supporting and maintaining said chip in place;
   a support member deformable under bending and twisting stresses;
   means fixedly coupling said second end of said conductive strips to said support member, said chip and at least a major sector of the area of said flexible sheet surrounding said aperature being free to move with respect to said support for largely isolating said chip and the conductive strips from stresses resulting from deformations of said support member.

* * * * *